(12) United States Patent
Tian et al.

(10) Patent No.: US 9,568,959 B1
(45) Date of Patent: Feb. 14, 2017

(54) COMPUTING APPARATUS

(71) Applicants: Inventec (Pudong) Technology Corporation, Shanghai (CN); INVENTEC CORPORATION, Taipei (TW)

(72) Inventors: Guang-Zhao Tian, Shanghai (CN); Jian-Jun Deng, Shanghai (CN); Ji-Peng Xu, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 14/935,598

(22) Filed: Nov. 9, 2015

(30) Foreign Application Priority Data

Aug. 19, 2015 (CN) .......................... 2015 1 0511981

(51) Int. Cl.
*G06F 1/16* (2006.01)
*G06F 1/18* (2006.01)

(52) U.S. Cl.
CPC ............... *G06F 1/184* (2013.01); *G06F 1/187* (2013.01)

(58) Field of Classification Search
CPC ................................ G06F 1/16; H01M 2/1077
USPC ............... 455/569.1, 456.1, 436, 414.1, 415, 404.1,455/550.1, 575.3, 558, 347, 419, 556; 361/679.27, 679.21, 679.31, 679.33, 361/679.01, 679.55, 679.25, 679.03, 679.56, 361/679.34, 679.47, 679.52; 280/623, 14.21, 280/607, 619; 257/737, 773, 686, 774, 421, 257/488; 174/258, 261, 266, 252, 520
See application file for complete search history.

(56) References Cited

U.S. PATENT DOCUMENTS

| | | | | |
|---|---|---|---|---|
| 8,662,505 | B2 * | 3/2014 | Cunningham | ......... A63C 10/18 280/14.24 |
| 9,048,482 | B2 * | 6/2015 | Lentine, Jr. | ......... H01M 2/1077 |
| 2010/0219613 | A1 * | 9/2010 | Zaloom | .................... A63C 5/03 280/613 |

FOREIGN PATENT DOCUMENTS

TW 201531205 A 8/2015

OTHER PUBLICATIONS

Taiwanese Office Action for corresponding application No. 104131421 mailed Jul. 13, 2016 (partial translation).

* cited by examiner

*Primary Examiner* — Hung Duong
(74) *Attorney, Agent, or Firm* — Maschoff Brennan

(57) ABSTRACT

A calculating apparatus includes a baseplate, a first mother board module and a connection module. The baseplate includes a bottom surface having a first component layout region, a second component layout region and a connection component layout region all arranged in order from a first side to a second side of the bottom surface. The first mother board is drawably disposed at the first component layout region of the bottom surface. The first mother board includes a first tray, a first control board, and a first electronic hard disk drive. The connection module is electrically connected to the first mother board module so that the first mother board module is capable of performing external communication through the connection module.

15 Claims, 8 Drawing Sheets

COMPUTING APPARATUS

CROSS-REFERENCE TO RELATED APPLICATIONS

This non-provisional application claims priority under 35 U.S.C. §119(a) on Patent Application No(s). 201510511981.0 filed in China on Aug. 19, 2015, the entire contents of which are hereby incorporated by reference.

BACKGROUND

Technical Field of the Invention

The disclosure relates to a computing apparatus, more particularly to a computing apparatus in which a drawable mother board module including a serial transmission interface and an electronic hard disk drive are disposed.

Description of the Related Art

Conventional computing apparatuses nowadays, such as desk-top computers and servers, are disposed with hard disk drives usually fixed inside their cases. However, this will limit the development of such a computing apparatus because the amount of hard disk drives disposed in the computing apparatus will be limited by a finite case. Moreover, in a modern server rack, mother boards of servers are mostly fixed on their respective chassis. When one of the chassis should be replaced, the bracket carrying the chassis to be replaced has to be pulled out. When the bracket is being pulled out, one or more chassis disposed on the bracket easily come off from the baseplate, resulting in system service outage.

SUMMARY

The disclosure provides a computing apparatus that includes a drawable mother board module including a serial transmission interface and an electronic hard disk drive so as to provide the extension to hard disk drives.

According to one or more embodiments, the disclosure provides a computing apparatus. In an embodiment, the computing apparatus includes a baseplate, a first mother board module, and a connection module. The baseplate has a bottom surface, and the bottom surface has a first side and a second side opposite to the first side along a first direction, and has a first component layout region, a second component layout region, and a connection component layout region. The first component layout region extends from the first side of the bottom surface to the second side of the bottom surface. The connection component layout region is farther from the first side of the bottom surface than the first and second component layout regions. The first mother board module is disposed at the first component layout region of the bottom surface and is capable of being drawn out from the first side to the second side of the bottom surface. The first mother board module includes a first tray, a first mother board, a first middle plate, a first control board, and a first electronic hard disk drive (e.g. SATA DOM, Serial ATA Disk on Module). The first tray is disposed at the first component layout region of the bottom surface. The first mother board is disposed on the first tray and includes a first central processing unit, a first electric connection port, and a second electric connection port. The first middle plate is electrically connected to the first mother board, includes a third electric connection port, is disposed on the first tray, and is farther from the first side of the bottom surface than the first mother board. The first control board includes a first serial transmission interface connection port and is selectively disposed on either the first mother board or the first middle plate so that the first serial transmission interface connection port is selectively coupled to either the first electric connection port or the third electric connection port. The first electronic hard disk drive is disposed on either the first mother board or the first middle plate selectively and includes a first serial bus connection port coupled to the second electric connection port when the first electronic hard disk drive is on the first mother board. The connection module is disposed at the connection component layout region of the baseplate and electrically connected to the first mother board module so that the first mother board module is capable of performing external communication through the connection module.

Accordingly, the computing apparatus can achieve the drawable disposition of the first mother board module on the baseplate of the computing apparatus by disposing the first mother board, the first middle plate, the first control board and the first electronic hard disk drive on the first tray. Moreover, the computing apparatus is extendable in functions and memory space by the disposition of the first control board including the first serial transmission interface connection port as well as the first electronic hard disk drive including the first serial bus connection port.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
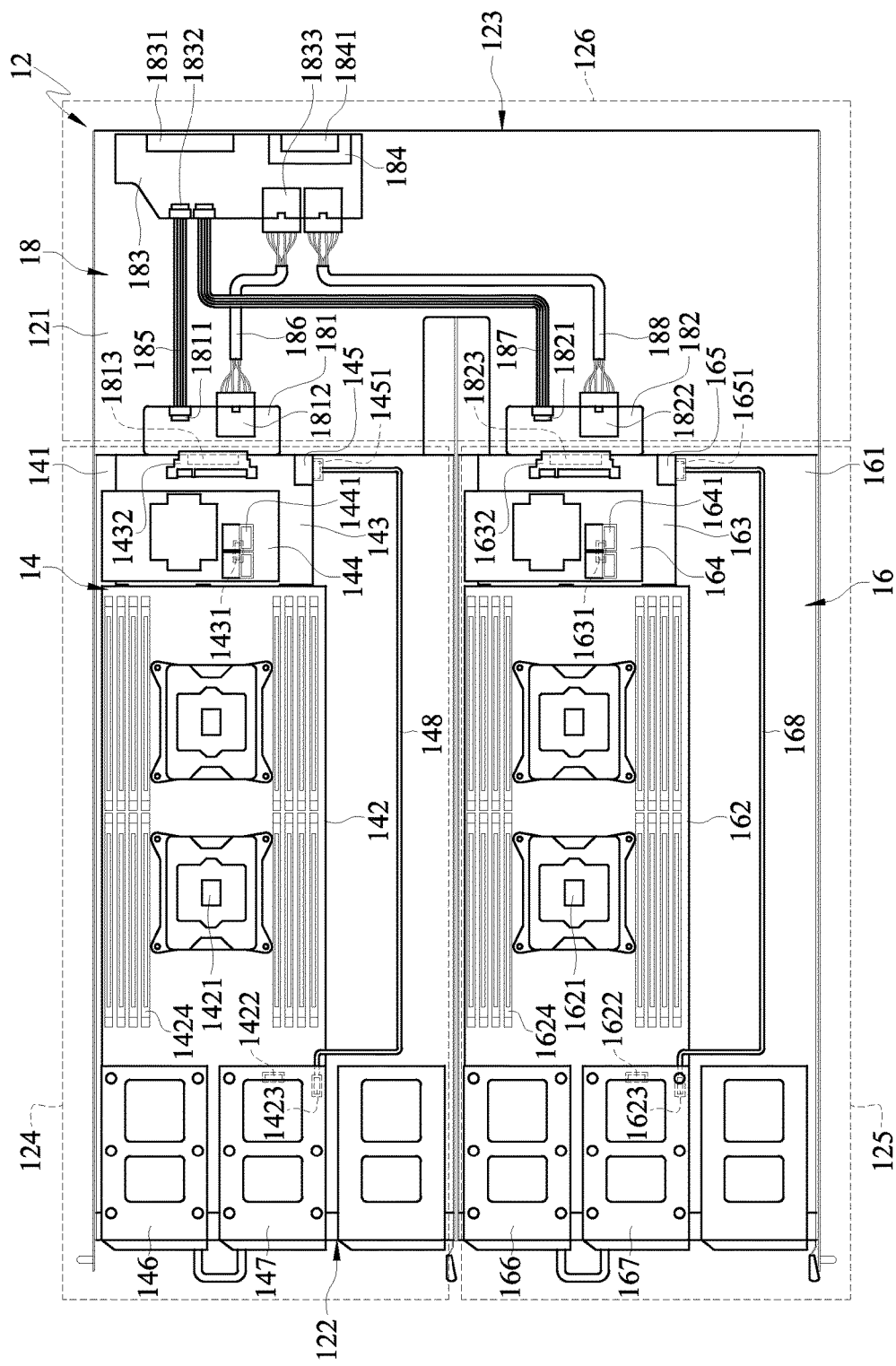
FIG. 1 is a schematic diagram of a computing apparatus in an embodiment.
Figure 2:
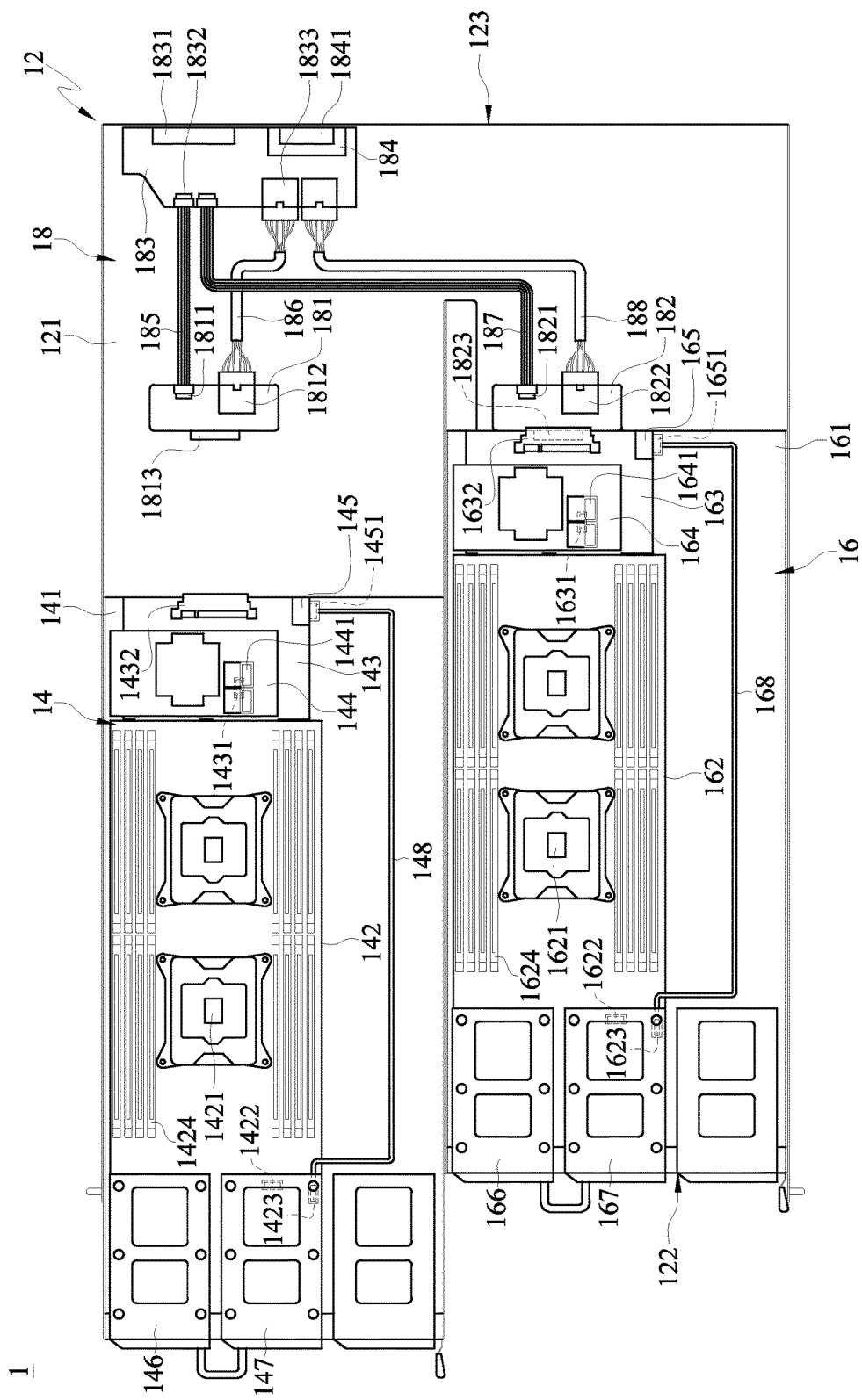
FIG. 2 is a schematic diagram of pushing or pulling the first mother board module on the baseplate in an embodiment.
Figure 3:
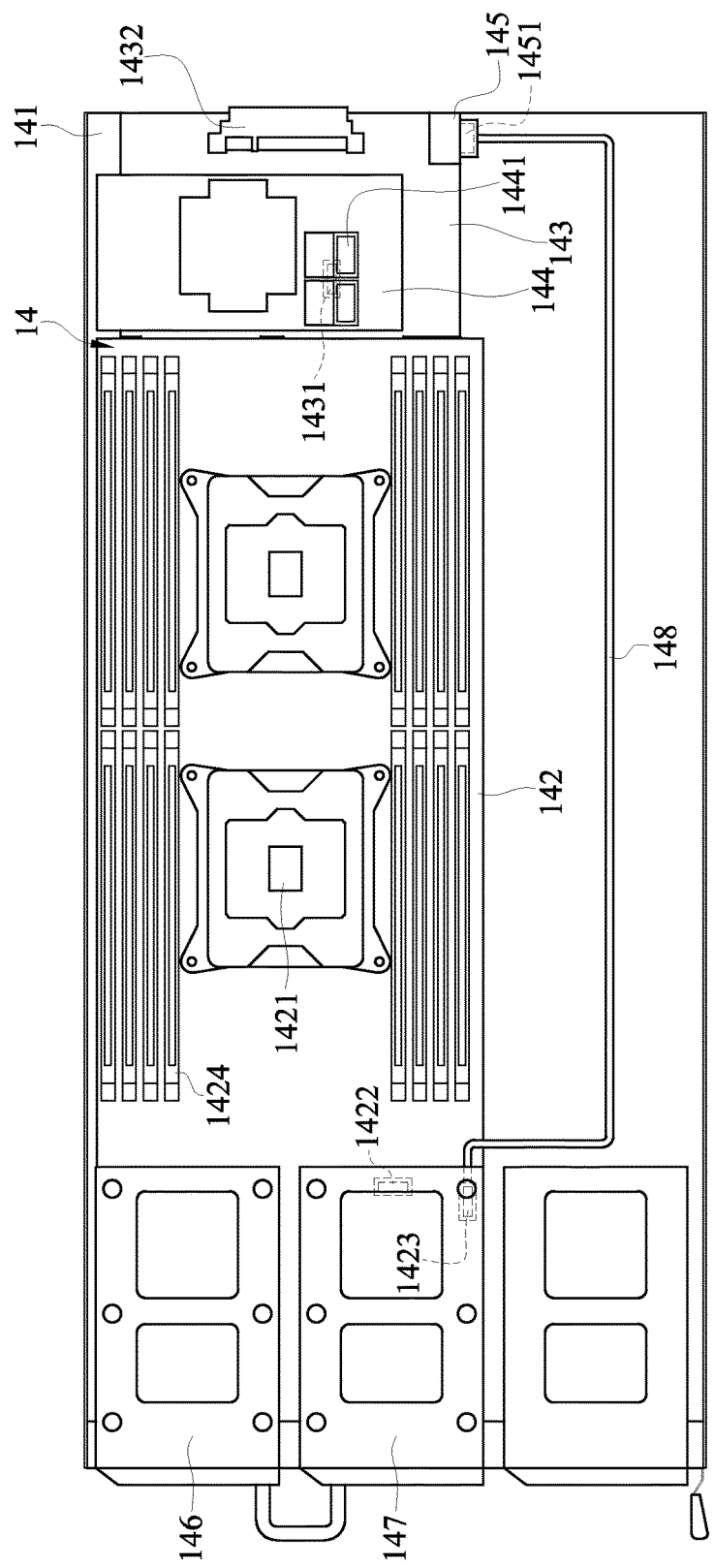
FIG. 3 is a schematic diagram of a first mother board module in an embodiment.

Please refer to FIGS. 1, 2 and 3, which are a schematic diagram of a computing apparatus 1, a schematic diagram of pushing or pulling the first mother board module on the baseplate, and a schematic diagram of a first mother board module, respectively. The computing apparatus 1 includes a baseplate 12, a first mother board module 14, a second mother board module 16, and a connection module 18. The baseplate 12 includes a bottom surface 121. The bottom surface 121 has a first side 122 and a second side 123 opposite to the first side 122 along a first direction. Also, the bottom surface 121 includes a first component layout region 124 extending from the first side 122 to the second side 123, a second component layout region 125, and a connection component layout region 126 that is farther from the first side 122 than the first component layout region 124 and the second component layout region 125. The first mother board module 14 is drawable from the first side 122 to the second side 123 and disposed at the first component layout region 124 of the bottom surface 121. The first mother board module 16 can be drawn from the first side 122 to the second side 123 and is at the first component layout region 125 of the bottom surface 121. The connection module 18 is at the connection component layout region 126 of the bottom surface 121. The first mother board module 14 and the second mother board module 16 are electrically connected to the connection module 18 in order to perform external communication through the connection module 18.

The first mother board module 14 includes a first tray 141, a first mother board 142, a first middle plate 143, a first control board 144, a first electronic hard disk drive (e.g., SATA DOM) 145, a first hard disk drive module 146, and a first extended hard disk drive module 147. The first tray 141 is at the first component layout region 124 of the bottom surface 121 in order to carry the first mother board 142, the first middle plate 143, the first electronic hard disk drive 145, the first hard disk drive module 146, and the first extended hard disk drive module 147. The first mother board 142 includes a first central processing unit 1421, a first electric connection port 1422, a second electric connection port 1423, and a memory set 1424. The first electric connection port 1422 is a SAS (Serial Attached SCSI) connection port, and the second electric connection port 1423 is a SATA (Serial Advanced Technology Attachment) connection port. The long edge of the memory set 1424 is parallel to a direction from the first side 122 of the bottom surface 121 to the second side 123 of the bottom surface 121. The memory set 1424 includes memories disposed two opposite sides of the first central processing unit 1421, respectively.

The first middle plate 143 is farther from the first side 122 of the bottom surface 121 than the first mother board 142 and is electrically connected to the first mother board 142. The first middle plate 143 includes a third electric connection port 1431, and the third electric connection port 1431 is a SAS (Serial Attached SCSI) connection port. The first control board 144 includes a first serial transmission interface connection port 1441, and the first electronic hard disk drive 145 includes a first serial bus connection port 1451. The first control board 144 is selectively disposed on the first mother board 142 or the first middle plate 143, and the first electronic hard disk drive 145 is selectively disposed on the first mother board 142 or the first middle plate 143.

In this embodiment, the first control board 144 is disposed on the first middle plate 143 and communicates with the first mother board 142 through the first middle plate 143. The first serial transmission interface connection port 1441 is connected to the third electric connection port 1431 of the first middle plate 143, and the first control board 144 and the first middle plate 143 are parallel to each other. The first electronic hard disk drive 145 is also disposed on the first middle plate 143, and the first serial bus connection port 1451 of the first electronic hard disk drive 145 is coupled to the second electric connection port 1423 on the first mother board 142 through the first cable line 148. The first hard disk drive module 146 and the first extended hard disk drive module 147 are disposed on the first mother board 142 near the first side 122 of the bottom surface 121.

The second mother board module 16 includes a second tray 161, a second mother board 162, a second middle plate 163, a second control board 164, a second electronic hard disk drive (e.g. SATA DOM) 165, a second hard disk drive module 166, and a second extended hard disk drive module 167. The second tray 161 is at the second component layout region 124 of the bottom surface 121 and can carry the second mother board 162, the second middle plate 163, the second electronic hard disk drive 165, the second hard disk drive module 166, and the second extended hard disk drive module 167. The second mother board 162 includes a second central processing unit 1621, a fourth electric connection port 1622, a fifth electric connection port 1623, and a memory set 1624. The fourth electric connection port 1622 is a SAS (Serial Attached SCSI) connection port, and the fifth electric connection port 1623 is a SATA (Serial Advanced Technology Attachment) connection port. The long edge of the memory set 1624 is parallel to a direction from the first side 122 to the second side 123 of the bottom surface 121, and memories of the memory set 1624 are disposed at two opposite sides of the second central processing unit 1621.

The second middle plate 163 is farther from the first side 122 of the bottom surface 121 than the second mother board 162, and the second middle plate 163 electrically connected to the second mother board 162. The second middle plate 163 includes a sixth electric connection port 1631 that is a SAS (Serial Attached SCSI) connection port. The second control board 164 includes a second serial transmission interface connection port 1641. The second electronic hard disk drive 165 includes a second serial bus connection port 1651. The second control board 164 is selectively disposed on the second mother board 162 or the second middle plate 163, and the second electronic hard disk drive 165 is selectively disposed on the second mother board 162 or the second middle plate 163.

In this embodiment, the second control board 164 is disposed on the second middle plate 163 and can communicate with the second mother board 162 through the second middle plate 163. The second serial transmission interface connection port 1641 is connected to the sixth electric connection port 1631 of the second middle plate 163. The second control board 164 is parallel to the second middle plate 163. The second electronic hard disk drive 165 is also disposed on the second middle plate 163, and the second serial bus connection port 1651 of the second electronic hard disk drive 165 is coupled to the fifth electric connection port 1623 on the second mother board 162 through the second cable line 168. The second hard disk drive module 166 and the second extended hard disk drive module 167 are disposed at the first side 122 of the bottom surface 121, on the second mother board 162 and near the bottom surface 121.

The first mother board 142 is electrically connected to the connection module 18 through the first middle plate 143, and the second mother board 162 is electrically connected to the connection module 18 through the second middle plate 163. The connection module 18 includes a first intermediate backboard 181, a second intermediate backboard 182, an end plate 183, and a signal board 184. The first intermediate backboard 181 is disposed at the connection component layout region 126 of the bottom surface 121 near the first component layout region 124, and is electrically connected to the first middle plate 143 of the first mother board module 14. The second intermediate backboard 182 is also disposed at the connection component layout region 126 near the first component layout region 124 and is electrically connected to the second middle plate 163 of the second mother board module 16. The end plate 183 is disposed at the connection component layout region 126 near the second side 123 of the bottom surface 121 and is electrically connected to the first intermediate backboard 181 and the second intermediate backboard 182. The signal board 184 is disposed at the connection component layout region 126 near the second side 123 of the bottom surface 121 and is also close to the end plate 183, and the signal board 184 is electrically connected to the end plate 183.

Specifically, the first middle plate 143 includes a connection port 1432, the second middle plate 163 includes a connection port 1632, the first intermediate backboard 181 includes a first power connection port 1811, a first signal connection port 1812, and a connection port 1813. The second intermediate backboard 182 includes a second power connection port 1821, a second signal connection port 1822, and a connection port 1823. The end plate 183 includes a power connection port 1831, a plurality of internal power connection ports 1832, and a plurality of internal signal connection ports 1833. The signal board 184 includes an external signal connection port 1841.

The first middle plate 143 is electrically connected to the connection port 1813 of the first intermediate backboard 181 through the connection port 1432, and the second middle plate 163 is electrically connected to the connection port 1823 of the second intermediate backboard 182 through the connection port 1632. The first power connection port 1811 of the first intermediate backboard 181 is coupled to the internal power connection port 1832 of the end plate 183 through the connection wire 185. The first signal connection port 1812 of the first intermediate backboard 181 is coupled to the internal signal connection port 1833 of the end plate 183 through the connection wire 186 so that through the end plate 183, the first intermediate backboard 181 can communicate with the signal board 184. The second power connection port 1821 of the second intermediate backboard 182 is coupled to the internal power connection port 1832 of the end plate 183 through the connection wire 187. The second signal connection port 1822 of the second intermediate backboard 182 is coupled to the internal signal connection port 1833 of the end plate 183 through the connection wire 188 so that the second intermediate backboard 182 can communicate with the signal board 184 through the end plate 183. The power connection port 1831 of the end plate 183 is electrically connected to an external power module so that the external power module can power the computing apparatus 1. The external signal connection port 1841 of the signal board 184 is electrically connected to other electronic device so that the signal transmission between the computing apparatus 1 and the connected electronic device can be fulfilled.

In this embodiment, the amount of the hard disk drive module, the extended hard disk drive module, the serial transmission interface connection port, the serial bus connection port, the network control interface module, the central processing unit, the memory set, and/or the electronic hard disk drive in the drawings is exemplary, and the persons skilled in the art can design the amounts of components in the computer apparatus according to their actual application requirements. Also, the persons skilled in the art should understand that the hard disk drive module, the extended hard disk drive module, the network control interface module and the memory set in the disclosure are not main components, so these secondary components can optionally be disposed in the computing apparatus.

Figure 4:
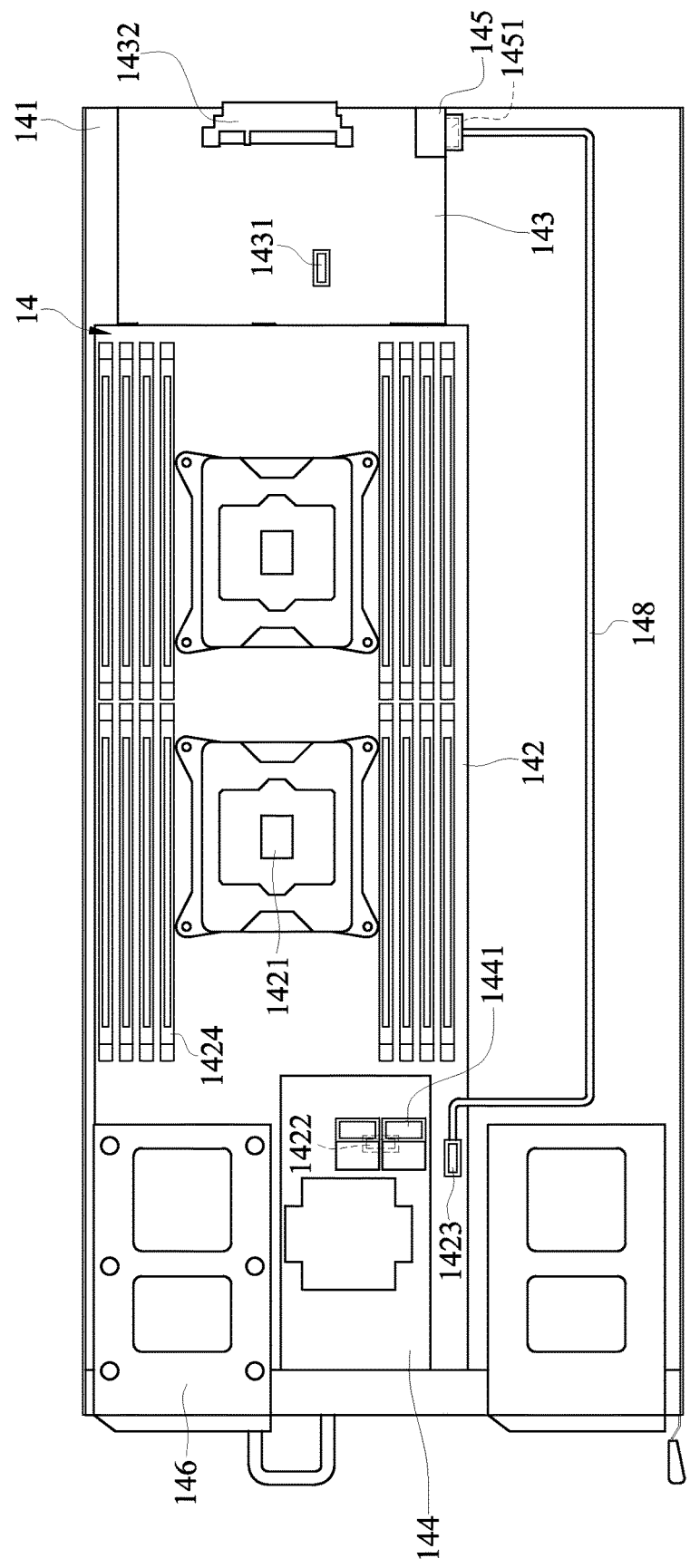
FIG. 4 is a schematic diagram of a first mother board module in another embodiment.

Other embodiments of the first mother board module 14 and the second mother board module 16 can be contemplated below with respect to FIGS. 4, 5 and 6. In order to concisely illustrate these embodiments, the first mother board module 14 and the second mother board module 16 are described by referring to the description of the first mother board module 14 as follows. In the drawings, the first mother board module 14 includes the first tray 141, the first mother board 142, the first middle plate 143, the first control board 144, the first electronic hard disk drive 145, the first hard disk drive module 146, and the first extended hard disk drive module 147. Different from the previous embodiment, the first control board 144 in FIG. 4 is disposed on the first mother board 142, and the first serial transmission interface connection port 1441 is connected to the first electric connection port 1422 on the first mother board 142 through the first control board 144.

Figure 5:
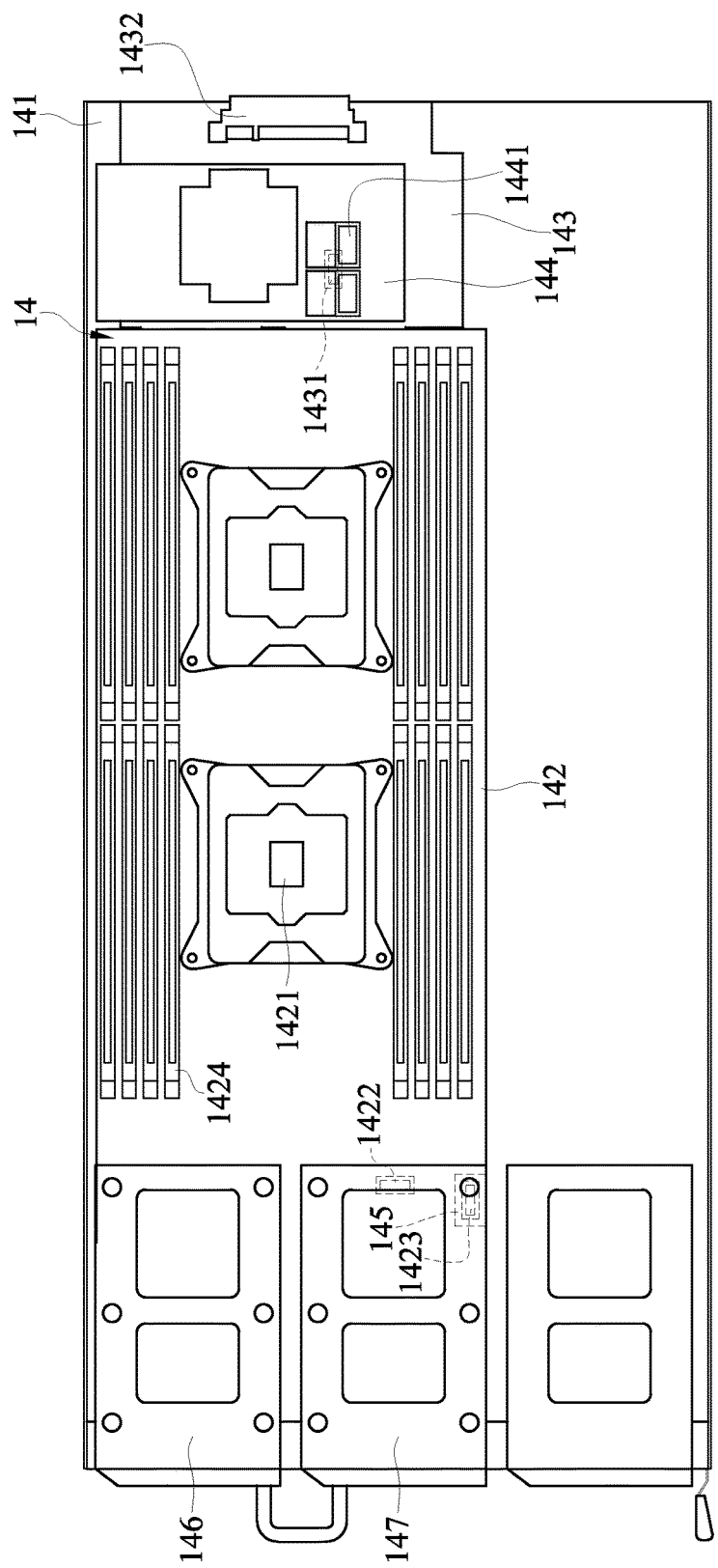
FIG. 5 is a schematic diagram of a first mother board module in another embodiment.
Figure 6:
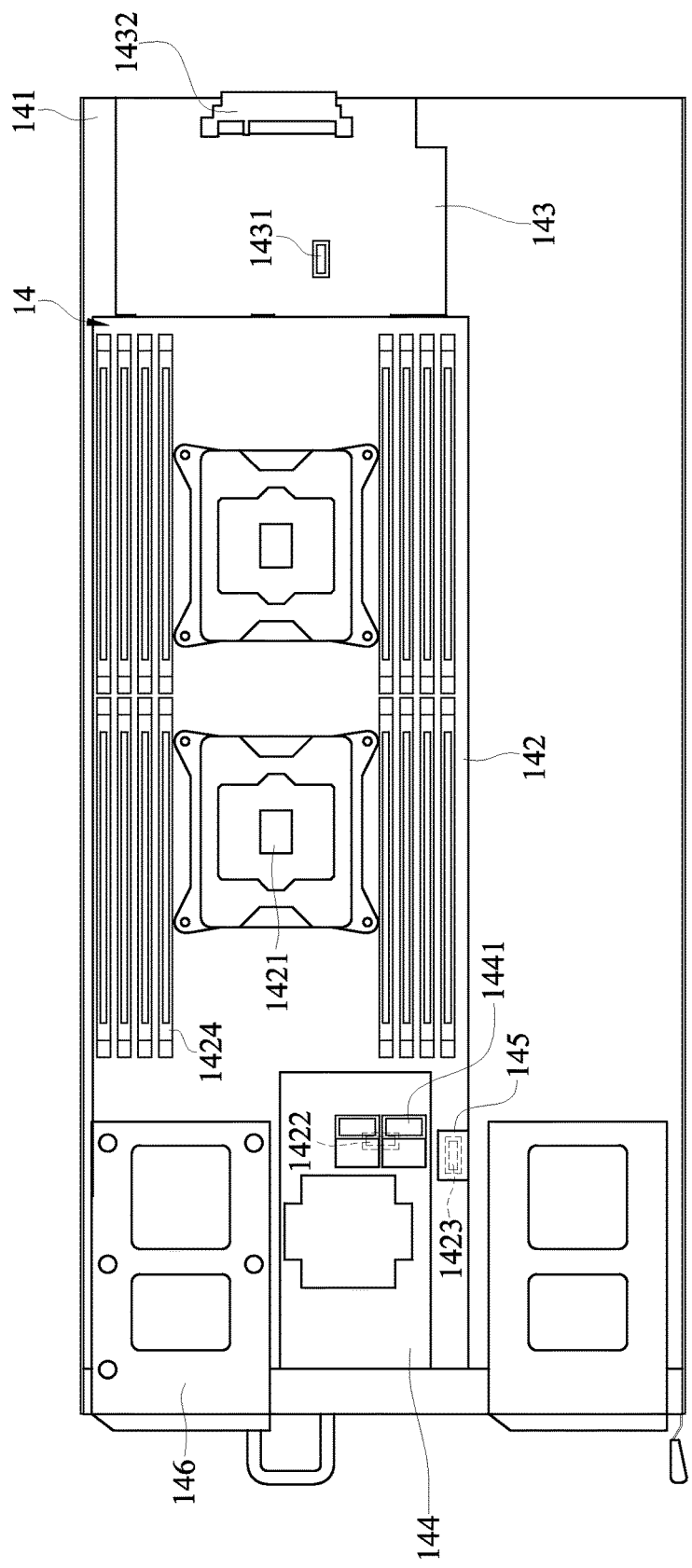
FIG. 6 is a schematic diagram of a first mother board module in another embodiment.

Different from the embodiments related to FIG. 3, the first electronic hard disk drive 145 in FIG. 5 is disposed on the first mother board 142 and is directly coupled to the second electric connection port 1423 on the first mother board 142. In FIG. 6, the first control board 144 is disposed on the first mother board 142, the first serial transmission interface connection port 1441 on the first control board 144 is connected to the first electric connection port 1422 on the first mother board 142 through the first control board 144, and the first electronic hard disk drive 145 is disposed on the first mother board 142 and is coupled to the second electric connection port 1423 on the first mother board 142.

Figure 7:
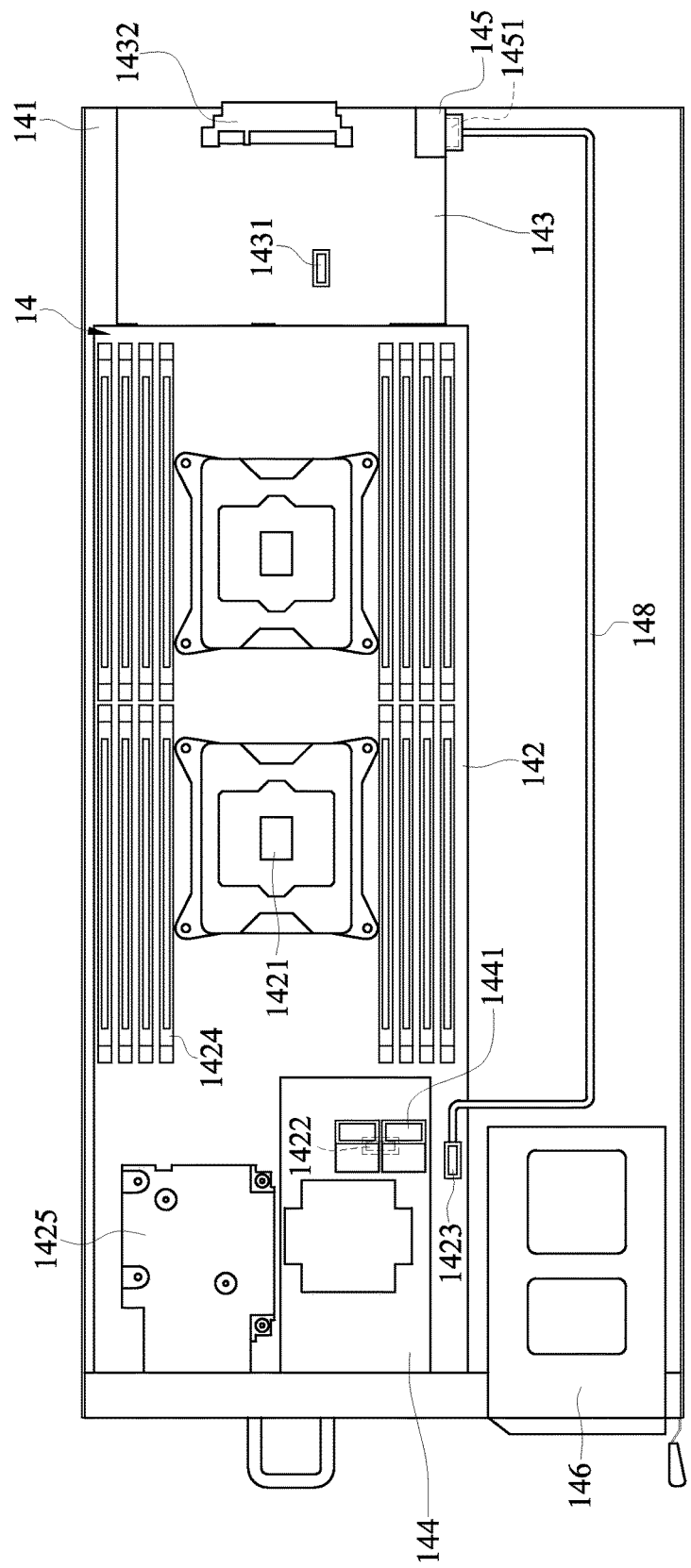
FIG. 7 is a schematic diagram of a first mother board module in another embodiment.

Moreover, yet other embodiments of the first mother board module 14 can also be contemplated below with respect to FIG. 7 and FIG. 8. Similar to the previous embodiments, the first mother board module 14 includes the first tray 141, the first mother board 142, the first middle plate 143, the first control board 144, the first electronic hard disk drive 145, and the first hard disk drive module 146. Different from the previous embodiments, as described in FIG. 7, the first control board 144 is disposed on the first mother board 142, the first serial transmission interface connection port 1441 is connected to the first electric connection port 1422 on the first mother board 142 through the first control board 144, the first hard disk drive module 146 is disposed on the first tray 141, and the first mother board module 14 further includes a network control interface module 1425. In FIG. 7, the first electronic hard disk drive 145 is disposed on the first middle plate 143, and the first serial bus connection port 1451 of the first electronic hard disk drive 145 is coupled to the second electric connection port 1423 on the first mother board 142 through the first cable line 148. The network control interface module 1425 is closer to the first side 122 of the bottom surface 121 than the first central processing unit 1421.

Figure 8:
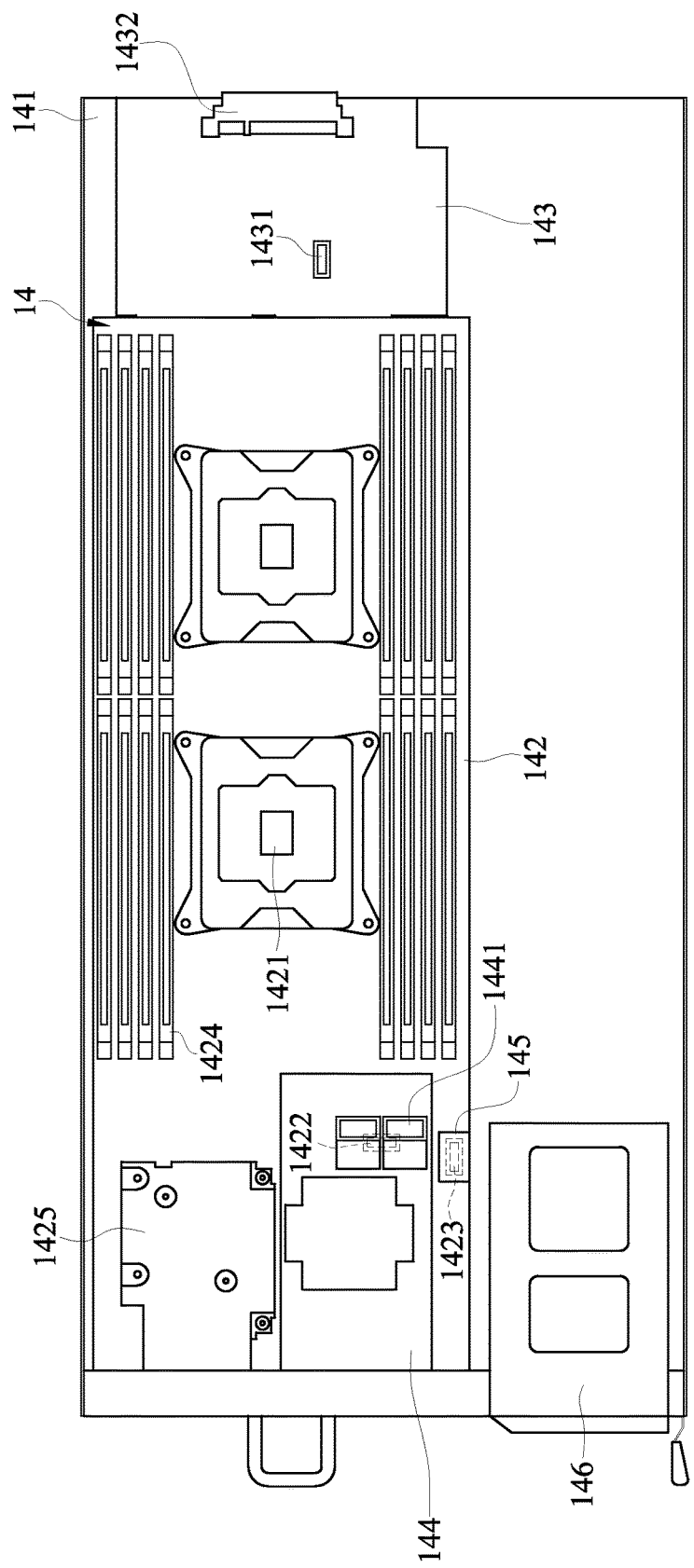
FIG. 8 is a schematic diagram of a first mother board module in another embodiment.

Different from the embodiments related to FIG. 7, as described in FIG. 8, the first electronic hard disk drive 145 is disposed on the first mother board 142 and is directly coupled to the second electric connection port 1423 on the first mother board 142.

As set forth above, the disclosure is involved with a computing apparatus, in which the drawable disposition of the first mother board module on the baseplate of the computing apparatus is carried out by disposing the first mother board, the first middle plate, the first control board and the first electronic hard disk drive on the first tray. Moreover, the computing apparatus is extendable in functions and memory space by the disposition of the first control board including the first serial transmission interface connection port as well as the first electronic hard disk drive including the first serial bus connection port.

What is claimed is:

1. A computing apparatus, comprising:
   a baseplate having a bottom surface that has a first side and a second side opposite to the first side along a first direction, and has a first component layout region, a second component layout region, and a connection component layout region, the first component layout region extending from the first side of the bottom surface to the second side of the bottom surface, and the connection component layout region being farther from the first side of the bottom surface than the first and second component layout regions;
   a first mother board module drawably disposed at the first component layout region of the bottom surface and comprising:
   a first tray disposed at the first component layout region of the bottom surface;
   a first mother board disposed on the first tray and comprising a first central processing unit, a first electric connection port, and a second electric connection port;
   a first middle plate electrically connected to the first mother board, comprising a third electric connection port, disposed on the first tray, and being farther from the first side of the bottom surface than the first mother board;
   a first control board comprising a first serial transmission interface connection port and selectively disposed on either the first mother board or the first middle plate so that the first serial transmission interface connection port is selectively coupled to either the first electric connection port or the third electric connection port; and
   a first electronic hard disk drive (SATA DOM, Serial ATA Disk on Module) disposed on either the first mother board or the first middle plate selectively and comprising a first serial bus connection port that is coupled to the second electric connection port when the first electronic hard disk drive is on the first mother board; and
   a connection module disposed at the connection component layout region of the baseplate and electrically connected to the first mother board module so that the first mother board module is capable of performing external communication through the connection module.

2. The computing apparatus according to claim 1, wherein the second component layout region comprises a second mother board module electrically connected to the connection module, being capable of performing external communication through the connection module, and comprising:
   a second tray disposed at the second component layout region of the bottom surface;
   a second mother board disposed on the second tray and comprising a second central processing unit, a fourth electric connection port, and a fifth electric connection port;
   a second middle plate electrically connected to the second mother board, comprising a sixth electric connection port, disposed on the second tray, and being farther from the first side of the bottom surface than the second mother board, the second middle plate;
   a second control board comprising a second serial transmission interface connection port and selectively disposed on either the second mother board or the second middle plate so that the second serial transmission interface connection port is selectively coupled to either the fourth electric connection port or the sixth electric connection port; and
   a second electronic hard disk drive selectively disposed on the second mother board or the second middle plate and comprising a second serial bus connection port that is coupled to the fifth electric connection port.

3. The computing apparatus according to claim 1, wherein the first mother board module further comprises a first hard disk drive module and selectively comprises a first extended hard disk drive module; and
   when the first mother board module comprises the first extended hard disk drive module, the first extended hard disk drive module is disposed on the first mother board and near the first side of the bottom surface, the first serial transmission interface connection port of the first control board is coupled to the third electric connection port, the first control board is capable of communicating with the first mother board through the first middle plate, and the first serial bus connection port of the first electronic hard disk drive is coupled to the second electric connection port through a first cable line.

4. The computing apparatus according to claim 2, wherein the second mother board module further comprises a second hard disk drive module and selectively comprises a second extended hard disk drive module; and
   when the second mother board module comprises the second extended hard disk drive module, the second extended hard disk drive module is disposed on the second mother board and near the first side of the bottom surface, the second serial transmission interface connection port of the second control board is coupled to the sixth electric connection port, the second control board is capable of communicating with the second mother board through the second middle plate, and the second serial bus connection port of the second electronic hard disk drive is coupled to the fifth electric connection port through a second cable line.

5. The computing apparatus according to claim 1, wherein the first electric connection port and the third electric connection port are serial attached SCSI (SAS) connection ports, and the second electric connection port is a serial advanced technology attachment (SATA) connection port.

6. The computing apparatus according to claim 2, wherein the fourth electric connection port and the sixth electric connection port are SAS connection ports and the fifth electric connection port is a SATA electric connection port.

7. The computing apparatus according to claim 2, wherein when the first serial transmission interface connection port is coupled to the third electric connection port, the first control board and the first middle plate are parallel to each other; and
   when the second serial transmission interface connection port is coupled to the sixth electric connection port, the second control board and the second middle plate are parallel to each other.

8. The computing apparatus according to claim 2, wherein the first mother board is electrically connected to the connection module through the first middle plate, and the second mother board is electrically connected to the connection module through the second middle plate.

9. The computing apparatus according to claim 2, wherein the connection module comprises:
   a first intermediate backboard disposed at the connection component layout region and near the first component layout region and electrically connected to the first middle plate of the first mother board module;

a second intermediate backboard disposed at the connection component layout region and near the second component layout region and electrically connected to the second middle plate of the second mother board module;

an end plate disposed at the connection component layout region and near the second side of the bottom surface, electrically connected to the first intermediate backboard and the second intermediate backboard, and comprising a power connection port that is electrically connected to an external power module and configured to power the computing apparatus; and a signal board disposed at the connection component layout region and near the second side of the bottom surface and the end plate, electrically connected to the end plate, and comprising an external signal connection port configured to perform external communication for the computing apparatus.

10. The computing apparatus according to claim 9, wherein the connection module further comprises a plurality of connection wires, the end plate further comprises a plurality of internal power connection ports and a plurality of internal signal connection ports, the first intermediate backboard comprises a first power connection port and a first signal connection port, the first power connection port is electrically connected to one of the plurality of internal power connection ports of the end plate through one of the plurality of connection wires, the first signal connection port is electrically connected to one of the plurality of internal signal connection ports of the end plate through one of the plurality of connection wires, the second intermediate backboard comprises a second power connection port and a second signal connection port, the second power connection port is electrically connected to one of the plurality of internal power connection ports of the end plate through one of the plurality of connection wires, and the second signal connection port is electrically connected to one of the plurality of internal signal connection ports through one of the plurality of connection wires.

11. The computing apparatus according to claim 1, wherein the first mother board module further comprises a network control interface module, which is electrically connected to the first mother board, disposed on the first mother board, and closer to the first side of the bottom surface than the first central processing unit.

12. The computing apparatus according to claim 1, wherein the first mother board module further comprises a memory set comprising a plurality of memories, long edges of the plurality of memories are parallel to a direction from the first side to second side of the bottom surface, and the plurality of memories is disposed at two opposite sides of the first central processing unit, respectively.

13. The computing apparatus according to claim 2, wherein there is another first central processing unit in the first mother board module, and there is another second central processing unit in the second mother board module.

14. The computing apparatus according to claim 1, wherein the first electric connection port and the second electric connection port are closer to the first side of the bottom surface than the first central processing unit.

15. The computing apparatus according to claim 2, wherein the fourth electric connection port and the fifth electric connection port are closer to the first side of the bottom surface than the second central processing unit.

* * * * *